(12) United States Patent
Sakata et al.

(10) Patent No.: US 8,637,380 B2
(45) Date of Patent: Jan. 28, 2014

(54) METHOD OF PROCESSING SILICON AND GLASS SUBSTRATES USING A LASER PEELING TECHNIQUE

(75) Inventors: Atsuko Sakata, Kanagawa-ken (JP); Kazuyuki Higashi, Kanagawa-ken (JP); Akiko Nomachi, Kanagawa-ken (JP); Takeshi Ishizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/607,381

(22) Filed: Sep. 7, 2012

(65) Prior Publication Data
US 2013/0252421 A1 Sep. 26, 2013

(30) Foreign Application Priority Data

Mar. 23, 2012 (JP) ................................ P2012-068110

(51) Int. Cl.
*H01L 21/30* (2006.01)
*H01L 21/44* (2006.01)

(52) U.S. Cl.
USPC ............................. 438/458; 438/667; 438/977

(58) Field of Classification Search
None
See application file for complete search history.

(56) References Cited

U.S. PATENT DOCUMENTS

2005/0106840 A1   5/2005   Arai

FOREIGN PATENT DOCUMENTS

| JP | 2003-037155 | 2/2003 |
| JP | 2004-253483 | 9/2004 |
| JP | 2005-183689 | 7/2005 |
| JP | 2007-242714 | 9/2007 |
| JP | 2010-098072 | 4/2010 |

*Primary Examiner* — Scott B Geyer
(74) *Attorney, Agent, or Firm* — Patterson & Sheridan, LLP (57) ABSTRACT

According to one embodiment, a method of manufacturing a semiconductor device including forming a metal film on aback surface of a glass substrate which supports a semiconductor substrate on a front surface thereof; forming a metal oxide film by oxidizing the whole or at least a portion of the metal film from the front surface; forming protective film, such as silicon nitride, on the metal oxide film; holding the front surface of the protective film with an electrostatic chuck; and forming a via for electrical connection in the semiconductor substrate while the front surface of the protective film is in contact with by the electrostatic chuck; then using a laser to delaminate the glass substrate from the semiconductor substrate.

20 Claims, 5 Drawing Sheets

|  | Ti 1 nm + OXIDATION | | Ti 3 nm + OXIDATION | | | Ti 5 nm + OXIDATION | | |
|---|---|---|---|---|---|---|---|---|
| POWER (W) | 20 | 30 | 20 | 30 | 40 | 20 | 30 | 40 |
| PEELING | A | A | C | B | B | C | B | B |
| DAMAGE on $TiO_x$ | A | A | B | B | B | C | C | C |

A: EXCELLENT
B: GOOD
C: MINOR DAMAGE IN PART

METHOD OF PROCESSING SILICON AND GLASS SUBSTRATES USING A LASER PEELING TECHNIQUE

CROSS-REFERENCE TO RELATED APPLICATION

This application is based upon and claims the benefit of priority from Japanese Patent Application No. 2012-068110, filed Mar. 23, 2012; the entire contents of which are incorporated herein by reference.

FIELD

Embodiments described herein relate generally to a method of manufacturing a semiconductor device and a glass substrate for supporting a semiconductor substrate.

BACKGROUND

In a TSV (Through-Silicon Via) process, a filter film forming process or the like, processing steps of polishing a silicon substrate, then laminating the silicon substrate to a glass substrate using a resin. In this case, various steps, such as a forming step, a Plasma Vapor Deposition process step, or a plasma Chemical Vapor Deposition step, require the substrate to be attracted to an ESC (Electro Static Chuck) within a process tool. The ESC enables temperature control and prevents displacement of a wafer during processing. When using an ESC, the substrate material should have a relatively low resistance and yet be capable of holding a charge supplied to the surface in contact with the ESC. This can be achieved by laminating a conductive sheet to a glass substrate which is laminated to the semiconductor wafer. Since the conductive sheet is laminated to the glass substrate using an adhesive resin, the conductive sheet will often become twisted or distorted during chucking. It may also be necessary to peel off the conductive sheet and resin before performing certain wet processing steps. These substrate mounting and detaching steps become extra processing steps or impose various limitations on further processing of the substrate.

DETAILED DESCRIPTION

In general, according to one embodiment, a method of manufacturing a semiconductor device includes: forming a Ti film on a back surface of a glass substrate which supports a semiconductor substrate on a front surface thereof; forming a Ti oxide film (TiOx) by oxidizing the whole or at least a portion of the Ti film from the front surface; forming a silicon nitride (SiN) film on the Ti oxide film; holding the front surface of the SiN film by an electrostatic chuck; and forming a via for electrical connection in the semiconductor substrate in a state where the holding of the front surface of the SiN film by the electrostatic chuck is maintained.

A method of manufacturing a semiconductor device and a glass substrate for supporting a semiconductor substrate according to embodiments are explained in conjunction with attached drawings. But it is to be understood that the present disclosure is not limited to these embodiments.

First Embodiment

This embodiment is explained mainly with respect to a TSV process, but may apply to more generally to any method of manufacturing a semiconductor device which uses a glass substrate.

Figure 1A:
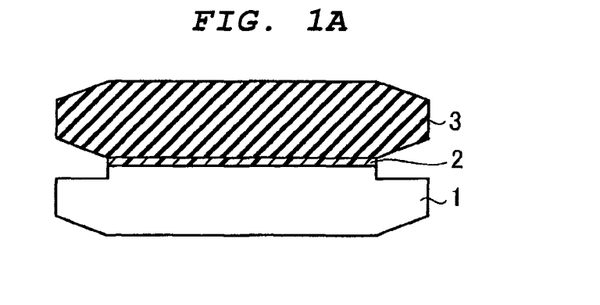
FIG. 1A to FIG. 1E are views showing a method of manufacturing a semiconductor device according to a first embodiment.

As shown in FIG. 1A, a glass support substrate 3 which is joined by a way of a resin 2 to a silicon (Si) substrate 1 on which a device element structure (not shown in the drawing) is prepared.

Figure 1B:
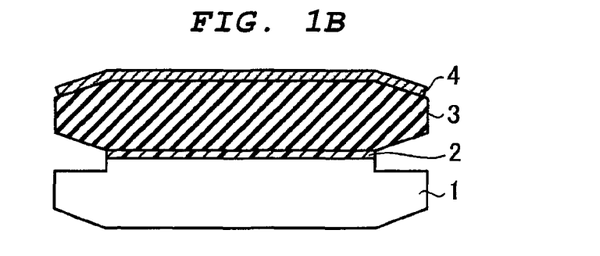
Figure 1C:
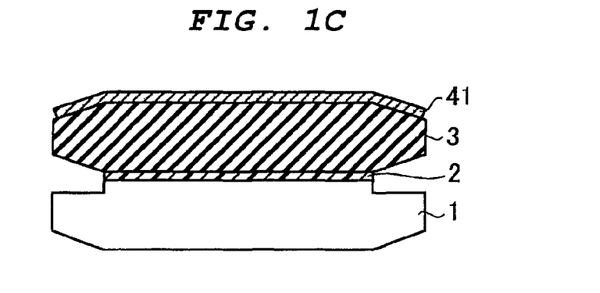

A Ti film 4 having a film thickness of 3 nm, for example, is formed directly on the glass substrate 3 using a sputtering device (FIG. 1B). The Ti film 4 having a film thickness of 3 nm is transformed into a TiOx film 41 by oxidizing the Ti film 4 in an $O_2$ gas or by natural oxidation by exposure to the atmosphere (FIG. 1C). For Ti film 4 having a thickness of 3 nm, the entire Ti film 4 can be transformed into TiOx film 41 through natural oxidization. However, when the film thickness of the Ti film 4 is greater than 3 nm, it is difficult to transform the entire Ti film 4 into the TiOx film 41 unless the oxidization is intentionally performed in an $O_2$ gas (positive oxidization).

Figure 1D:
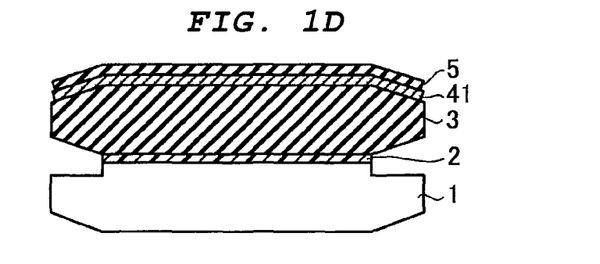

Next, a SiN film having a film thickness of approximately 100 nm is formed on the TiOx film 41, thus forming a protective film 5 for the TiOx film 41 (FIG. 1D). The SiN film 5 is formed by a film forming method such as a plasma SiN forming method or CVD.

Figure 1E:
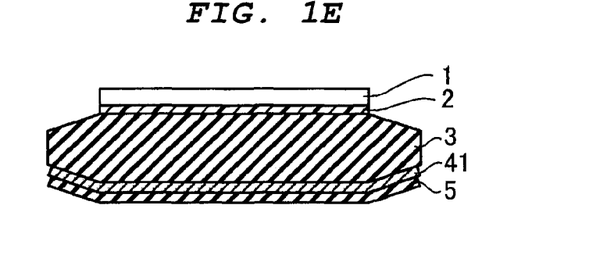

After forming SiN film 5, the back surface of the silicon substrate 1 is polished (FIG. 1E), thus providing the substrate structure for a TSV.

Though not depicted in FIG. 1, after polishing, a via for electrical connection is formed in the substrate structure using various deposition, patterning, and etching steps. The vias formed enable bonding with an device element.

For example, for forming a barrier seed, a wafer is conveyed to a sputtering chamber, the wafer is placed on the ESC, and the surface of the SiN film 5 is placed in contact with the chuck. Thereafter, a Ti film is formed on the polished silicon substrate 1, the substrate structure is conveyed continuously in vacuum to prevent oxidation of the Ti film and the substrate is rechucked, and a Cu film is formed on the Ti film. Thereafter, the via may be filled/embedded by plating. The formation of the via is explained in detail in the second embodiment.

Figure 2:
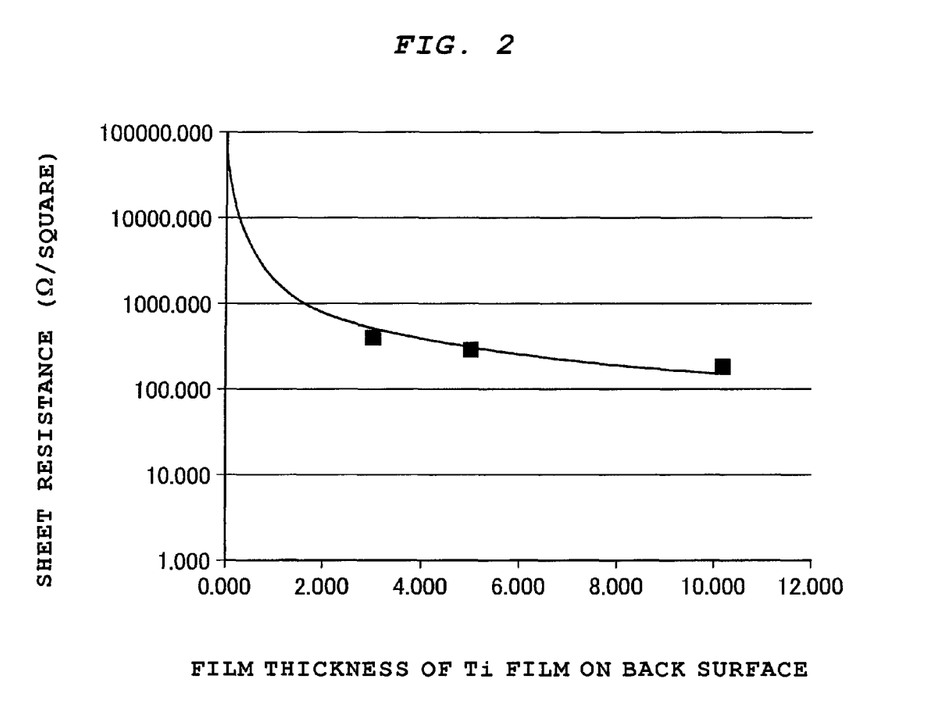
FIG. 2 is a graph showing measurement results of sheet resistance, Rs ($\Omega$/square), of a film which is made of titanium (Ti) and was exposed to atmosphere after formation. The film thickness at the time of forming the Ti film is on the X-axis.

FIG. 2 shows the result of measurement of sheet resistance, Rs ($\Omega$/square), of a film which is made of Ti and is exposed to atmosphere after formation The film thickness at the time of forming the Ti made film is on the X-axis. The sheet resistance of the Ti film before oxidization is approximately $1\times10^5$ $\Omega$/square. For example, when a 3 nm film Ti is exposed to the atmosphere, the resultant TiOx film has a sheet resistance value of approximately 400 $\Omega$/square, as shown in FIG. 2.

This sheet resistance value is a remarkably low value compared to the sheet resistance $1\times10^5$ Ω/square of non-oxidized Ti.

With respect to the ESC, a charge is generated on the back surface of the substrate due to the injection of charge from the ESC plate or the induction of a charge by Coulomb forces, thus generating a chucking force between the ESC plate and the substrate. Accordingly, it is necessary to inject a charge to the back surface of the substrate with low resistance.

A Ti film is fully converted into TiOx by natural, atmospheric oxidation when it has a thickness of approximately 3 nm or less. When a thickness of the Ti film is more than approximately 3 nm, the laminated structure of a TiOx/Ti film is formed. However, the resistance is lowered by an amount corresponding to the increase of in film thickness resulting from oxidation. TiOx is a semiconductor, so even when no Ti film remains after oxidation, the overall sheet resistance may still be acceptable.

In the final step of the process, the laminated wafer will be peeled off by applying a peeling laser beam having a wavelength in the 200 nm to 1700 nm range. The peeling laser beam must pass through to the peeling interface layer, thus it must pass through one or more layers of the substrate. A YAG laser beam having a wavelength of 1062 nm can be used as the peeling laser beam. It is necessary for the YAG laser beam to pass through the TiOx film to reach the peeling interface. A formula which expresses the optical transmittance, Using Lambert-Beer's Law, the optical transmittance is expressed by the following formula:

$$I/I_0 = \exp(\alpha L) = \exp(-4\pi k/\lambda \times L).$$

Here, I is the intensity of light at a depth position L, $I_0$ is the intensity of incident light, $I/I_0$ is the optical transmissivity, $\alpha$ is the absorption coefficient, k is the attenuation coefficient, and L is the distance into the film.

Figure 3:
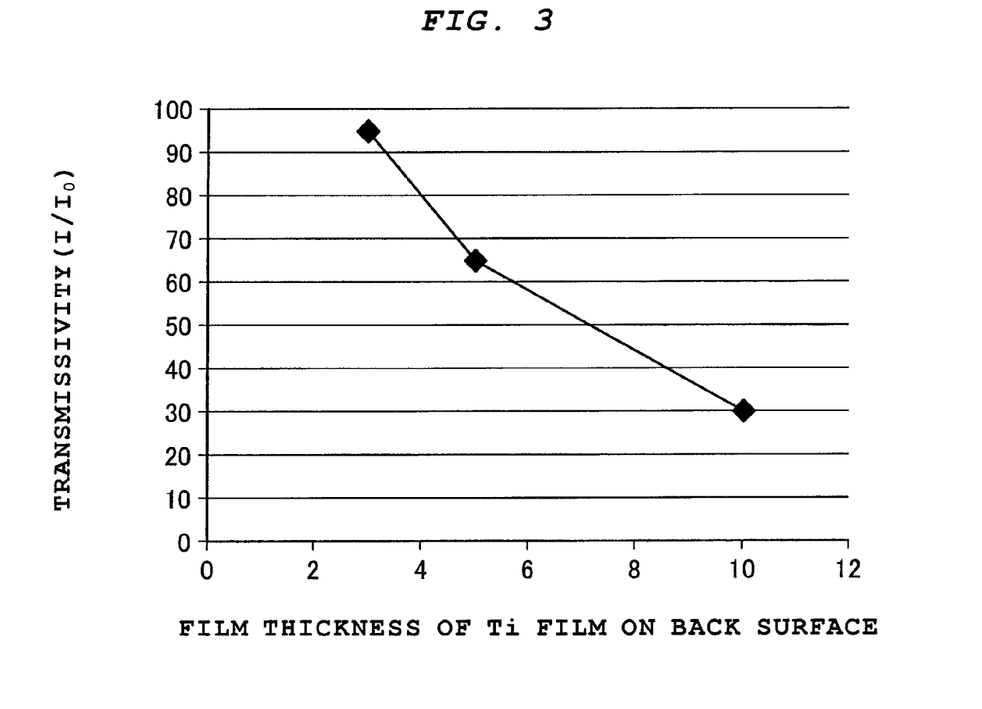
FIG. 3 is a graph showing the dependency of transmissivity, $I/I_0$, of a film which is made of Ti and is exposed to atmosphere after formation on film thickness.

FIG. 3 shows dependency of transmissivity $I/I_0$ on film thickness obtained in the actual manufacture of a semiconductor device in accordance with this embodiment. In the same manner as FIG. 2, a film thickness of a Ti film at the time of forming the film is taken on an X-axis. Using this result and the above-described formula, the attenuation coefficient of the TiOx film is expected to be approximately 0.5 to 2. However, it is also possible to use tantalum (Ta), tungsten (W), molybdenum (Mo) or the like which would exhibit a similar value.

The attenuation coefficient of the TiOx film is taken to be 0.5 to 2 for 1062 nm wavelength of light so that provided that the initial Ti film thickness is 3 nm, transmissivity would be approximately 90% or more. In this manner, by forming an oxide of metal on the back surface of the glass substrate and by forming a protective film of SiN, which exhibits attenuation coefficient of 0 at the 1062 nm wavelength, the film can withstand a substrate peeling step (step for peeling the resin 2) of the TSV process flow. The TSV flow can be carried out while avoiding the need for peeling to use the laminated conductive resin. The SiN film also exhibits resistance to later wet etching steps and hence, the SiN film is preferable from this point of view also.

Figure 5:
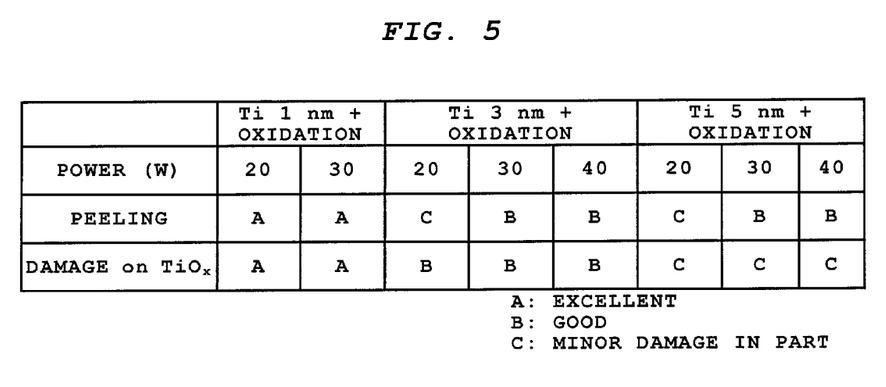
FIG. 5 is a table showing qualitative peeling results obtained by performing a laser peeling test where the laser beam passes through a TiOx/SiN. Damage to the TiOx film is also reported.

FIG. 5 shows peeling test results for the glass and silicon substrates where a peeling laser beam at various powers is passed a TiOx/SiN film. Damage to the TiOx film is also qualitatively evaluated. Continuous or pulsed lasers may be used for peeling, but FIG. 5 is for a case where a pulse laser beam is used. The output power of the laser was varied between 20 W and 40 W. The initial thickness of the Ti film was also varied. The initial Ti films were allowed to naturally oxidize to generate a TiOx film. Peeling performance and the apparent damage to the TiOx film were qualitatively evaluated. Peeling performance was excellent for the thinnest initial Ti films, with limited to no damage to the TiOx film at laser output powers of 20 W and 30 W. The thickest initial Ti films produced acceptable peeling performances at higher laser output powers (30 W and 40 W). Damage to the TiOx film was generally worse with thicker initial TI films. Based on the results in FIG. 5, initial Ti film thickness will preferably be 3 nm or less.

Second Embodiment

Referring now to FIG. 4A to FIG. 4I, a glass substrate with a metal oxide film and a second film having an attenuation coefficient of 0 at the wavelength of the peeling laser, for example a yttrium aluminum garnet (YAG) laser, is incorporated in a TSV process flow (a via forming process).

Figure 4A:
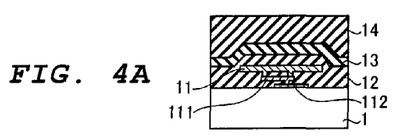
FIG. 4A to FIG. 4I are views showing a method of manufacturing a semiconductor device according to a second embodiment.
Figure 4B:
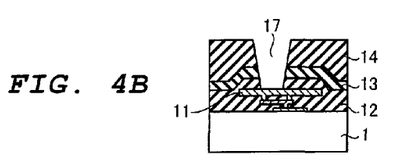

Lower-layer electrodes (not shown in the drawing) which are electrically connected to semiconductor elements (not shown in the drawing) in semiconductor (silicon) substrate 1, and multi-level lines 11, 111, 112 which are connected to the lower-layer electrodes are formed. An insulating film 12, for example $SiO_2$, is formed as an uppermost layer over multi-level lines 11, 111, 112. Metal line 11, comprising for example aluminum, and a film 13, comprising for example SiN, is formed over film 12 by a plasma CVD method.

Figure 4C:
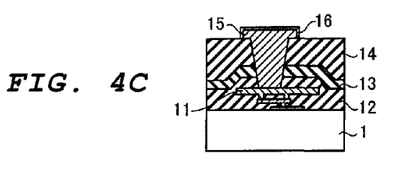

Next, a photosensitive polyimide film 14 is stacked on film 13 (FIG. 4A). A lithography step then patterns the via. The via 17 is then etched by RIE so that the via 17 is open to the upper surface of line 11. The diameter of via 17 is set to approximately 15 μm, for example. In forming via 17, the opening may be formed through the upper surface of the SiN film 13, penetrating to the upper surface of line 11. Next, Ni film 15 is formed in via 17 by non-electrolytic plating. Film 15 is plated until it projects approximately 3 μm from the surface of polyimide film 14. This forms a Ni post. A palladium/gold (Pd/Au) film 16 is formed over the Ni post (FIG. 4C). This non-electrolytic plating step may be replaced by electrolytic plating after a barrier/seed film, for example, a Ti/Cu film is formed. In such a case, after forming the barrier/seed film, a resist film is formed and patterned, a pattern corresponding to the location eventual of a post is formed on polyimide film 14 and electrolytic plating is performed. In performing electrolytic plating, a plated film is formed up to a height of the patterned resist. The resist layer and barrier seed may be removed by wet etching. Whether non-electrolytic plating or electrolytic plating is used, Ni, Cu, and Sn may be used as the plating/embedding material.

Figure 4D:
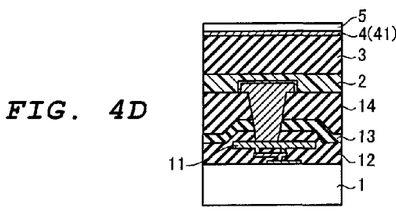

After formation of the post, an adhesive agent 2 (resin) is applied over post 15 and film 16. A glass support substrate 3 is then laminated to the substrate by the adhesive agent 2 (FIG. 4D). Next, using the lower surface of silicon substrate 1 side as a conveying surface (i.e. the surface in contact with a wafer chucking mechanism), the wafer with glass substrate 3 on its upper surface is placed inside a sputtering device. A Ti film 4 having a film thickness of approximately 3 nm is deposited on the surface of glass substrate 3. After deposition, the Ti film 4 can be exposed to the atmosphere or is exposed to an oxygen atmosphere to form a TiOx film. It is not always necessary to oxidize the whole Ti film 4, and a portion of the Ti film 4 may remain without being transformed into the TiOx film 41. Instead of the Ti film 4, a film 4 may be formed using tantalum (Ta), tungsten (W), molybdenum (Mo), or the like, and similarly the whole or only a part of the metal film may be oxidized.

Figure 4E:
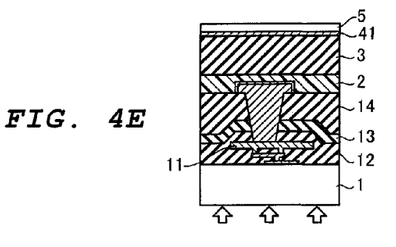
Figure 4F:
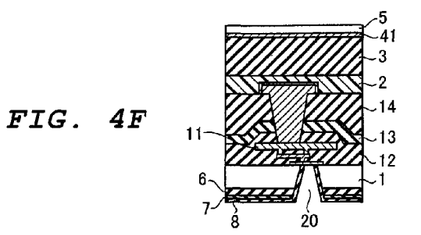

After forming film 41, a protective film 5 having a film thickness of 50 nm to 100 nm is formed by a plasma CVD method (FIG. 4D). Film 5 may be formed using SiN, SiO$_2$, SiON, SiOC, SiCN, SiCON or the like. These materials form films having an attenuation coefficient close to 0 at the wavelength of the peeling laser, for example a YAG laser, so may be used in embodiments of this invention. After deposition of film 5 the silicon substrate 1 side may be thinned (decreased in thickness) by polishing (FIG. 4E). The structure is now ready for additional processing including formation of a backside via (FIG. 4F).

Next, using the glass support substrate 3 face of the wafer facing towards an ESC, an SiO$_2$ film 6 is formed on silicon substrate 1 by a CVD method. Film 6 protects the surface of silicon substrate 1. A film 7 of P—SiN material is formed over SiO$_2$ film 6 (FIG. 4F.

A resist layer (not shown) for forming a via 20 is formed over film 7 and a lithography process is used to pattern silicon substrate 1 with via 20. The formation of the via 20 is halted when via 20 has penetrated through the silicon substrate 1 and then a CVD-SiO$_2$ film 8 is formed as a side wall barrier on the exposed surfaces of via 20 (FIG. 4F). After formation of film 8, the bottom of via 20 is penetrated and the via is etched to the desired metal level for connection to metal lines 11, 111, or 112 (FIG. 4F). Via 20 may be connected to any line as may be dictated by device design.

Figure 4G:
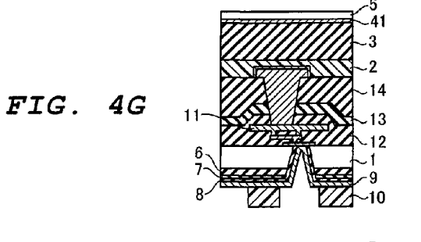

After the via is opened to the appropriate metal level, an under barrier metal (UBM) film 9 is formed. UBM film 9 also acts a seed film for plating steps. Film 9 in this example is a Ti barrier film having a thickness of 50 to 100 nm followed by a Cu seed film having a film thickness of 100 to 500 nm (FIG. 4G). The TiOx film 41 and SiN film 5 previously coated on glass support substrate 3 allows the wafer to be chucked and handled with the silicon substrate 1 side facing up for processing of backside via 20. Glass substrate 3 when coated with film 41 and film 5 can be chucked by ESC in a sputtering device, for example. Temperature control can be also performed to some extent, though the glass substrate acts a partial thermal insulator.

Figure 4H:
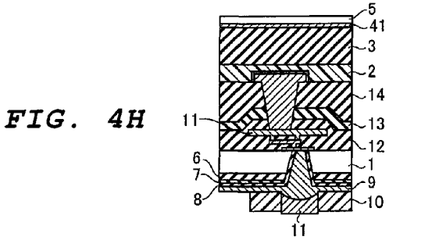
Figure 4I:
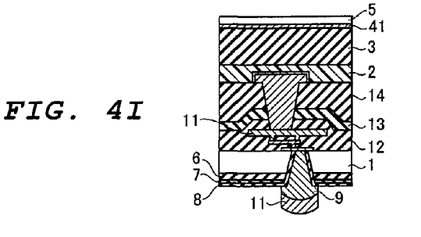

After forming the Ti/Cu (UBM) film 9, a resist 10 is patterned on the surface of the Ti/Cu (UBM) film 9 to allow plating of additional copper metal in via 20 (FIG. 4H). When the plating reaches the desired thickness, plating is stopped. FIG. 4H shows plating height exceeding the surface of substrate 1. A nickel, copper, tin, or tin-silver film is then formed as a bump 11 (FIG. 4H). After bump 11 is formed, resist film 10 and the portion of UBM film 9 not covered by bump 11 are removed (FIG. 4I). The bump process is finished through reflow and wafer processing is completed (FIG. 4I). Although Cu is used to fill the via in this embodiment (plated film 9), other materials such as Ni or Sn may be used instead.

Metal oxide films, such as TiOx, may be formed by natural oxidization of the metal film. Alternatively, the metal oxide film may be formed by subjecting the deposited metal film to an oxidizing atmosphere. The metal film may also be heated to promote oxidation or may be subjected to oxygen plasma or radical treatment. It is preferable when heating the wafer not to exceed the temperature at which the laminating resin is stable, for commonly used resins this is approximately 200 to 250° C. or less. Instead of oxidation of deposited metal film, a metal oxide film may be formed directly by sputtering or other deposition techniques.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    using a glass substrate to support a semiconductor substrate by attaching a first face of the glass substrate to a face of the semiconductor substrate;
    forming a metal film on a second face of the glass substrate, the second face substantially parallel to the first face of the glass substrate;
    forming a metal oxide film over the second face of the glass substrate;
    forming a insulator film over the metal oxide film;
    holding the second face of the glass substrate using an electrostatic chuck in contact with the insulator film; and
    performing device processing steps while the second face of the glass substrate is held using an electrostatic chuck in contact with the insulator film.

2. The method of claim 1, wherein the metal film is titanium.

3. The method of claim 2, wherein the titanium film is approximately 3 nm or less.

4. The method of claim 1, wherein the metal oxide film is formed by exposing the metal film to the atmosphere.

5. The method of claim 1, wherein metal oxide film is formed by complete oxidation of the metal film.

6. The method of claim 1, wherein forming the metal oxide film involves partial oxidation of the metal film.

7. The method of claim 1, wherein the insulator film is silicon nitride.

8. The method of claim 1, wherein the device processing steps comprise steps for making a through-silicon via for electrical connection.

9. The method of claim 1, further comprising using laser light transmitted through the insulator film and the metal oxide film to delaminate the glass substrate and the semiconductor substrate.

10. The method of claim 1, wherein the metal oxide film has an attenuation coefficient of 0.5 to 2 at an emission wavelength of a laser suitable for use in a substrate delaminating process.

11. The method of claim 1, wherein the metal film, the metal oxide film, and the insulator film are formed on the glass substrate before the glass substrate is attached to the semiconductor substrate.

12. A method of manufacturing a semiconductor device, comprising:
    forming a metal film on a first face of glass substrate;
    oxidizing the metal film to form a metal oxide film;
    forming an insulator film over the metal oxide film;
    laminating the glass substrate to a semiconductor substrate;
    placing the laminated substrates in contact with an electrostatic chuck, such that the insulator film is in direct contact with the chuck; and
    processing the exposed face of the semiconductor substrate while the laminated substrates are in contact with an electrostatic chuck.

13. A the method of claim 12, further comprising:
    using light from a laser to separate the glass substrate from the semiconductor substrate.

14. The method of claim 13, wherein the laser light is supplied by a YAG laser.

15. The method of claim 12, wherein the processing of the exposed face of the semiconductor substrate comprises:
- thinning the semiconductor substrate by polishing;
- etching a via through the semiconductor substrate; and
- plating metal into the via.

16. The method of claim 15, wherein the metal plated into the via is selected from a group comprising copper, nickel, and tin.

17. The method of claim 12, wherein the metal film is titanium, approximately 3 nm or less in thickness.

18. The method of claim 12, wherein the insulator film is selected from a group comprising SiN, SiO2, SiON, SiCN, and SiCON.

19. A method of manufacturing a semiconductor device, comprising:
- forming a titanium film of approximately 3 nm or less on a glass substrate;
- oxidizing the titanium film by exposure to air, such that essentially all of the titanium film is converted to a titanium oxide film;
- depositing a silicon nitride insulator film over the titanium oxide film;
- laminating the glass substrate to a semiconductor substrate, such that the silicon nitride insulator film is not placed in direct contact with the semiconductor substrate;
- polishing the face of the semiconductor substrate not in contact with the glass substrate;
- etching a via through the semiconductor substrate;
- opening the via to a desired metal level for electrical connection;
- plating metal into the via; and
- delaminating the glass substrate and the semiconductor substrate by using light from a laser source transmitted through face of the glass substrate covered with the silicon nitride insulator film.

20. The method of claim 19, wherein an electrostatic chuck is used to hold the laminated wafers such that the silicon nitride insulator film is in direct contact with the chuck.

* * * * *

UNITED STATES PATENT AND TRADEMARK OFFICE
CERTIFICATE OF CORRECTION

PATENT NO. : 8,637,380 B2  
APPLICATION NO. : 13/607381  
DATED : January 28, 2014  
INVENTOR(S) : Atsuko Sakata et al.

Page 1 of 1

It is certified that error appears in the above-identified patent and that said Letters Patent is hereby corrected as shown below:

In the Claims

In column 6, claim 1, line 17, please delete "a insulator" and replace with "an insulator".

In column 6, claim 13, line 63, please delete "A the" and replace with "The".

Signed and Sealed this
First Day of July, 2014

Michelle K. Lee
*Deputy Director of the United States Patent and Trademark Office*